(12) United States Patent
Johansson et al.

(10) Patent No.: US 8,389,115 B2
(45) Date of Patent: Mar. 5, 2013

(54) THERMALLY STABILIZED (TI,SI)N LAYER FOR CUTTING TOOL INSERT

(75) Inventors: Mats Johansson, Linkoping (SE); Jon Andersson, Vasteras (SE); Axel Flink, Linkoping (SE); Lars Hultman, Linkoping (SE)

(73) Assignee: Seco Tools AB, Fagersta (SE)

( * ) Notice: Subject to any disclaimer, the term of this patent is extended or adjusted under 35 U.S.C. 154(b) by 259 days.

(21) Appl. No.: 12/919,269

(22) PCT Filed: Mar. 3, 2009

(86) PCT No.: PCT/SE2009/000118
§ 371 (c)(1),
(2), (4) Date: Nov. 12, 2010

(87) PCT Pub. No.: WO2009/110829
PCT Pub. Date: Sep. 11, 2009

(65) Prior Publication Data
US 2011/0058912 A1    Mar. 10, 2011

(30) Foreign Application Priority Data
Mar. 7, 2008   (SE) ...................... 0800536

(51) Int. Cl.
*B32B 9/00*   (2006.01)
(52) U.S. Cl. ....... 428/336; 51/307; 51/309; 204/192.15; 204/192.16; 428/457; 428/469; 428/697; 428/698; 428/699
(58) Field of Classification Search ............ 51/307, 51/309; 428/216, 336, 457, 469, 697, 698, 428/699; 204/192.15, 192.16
See application file for complete search history.

(56) References Cited

U.S. PATENT DOCUMENTS

| | | | | |
|---|---|---|---|---|
| 5,423,923 A * | 6/1995 | Yamagata et al. | ............ | 428/627 |
| 6,033,768 A | 3/2000 | Muenz et al. | | |
| 6,586,122 B2 * | 7/2003 | Ishikawa et al. | .............. | 428/697 |
| 6,858,333 B2 * | 2/2005 | Henderer | ........................ | 428/698 |
| 7,348,074 B2 * | 3/2008 | Derflinger | ..................... | 428/699 |

FOREIGN PATENT DOCUMENTS

| | | |
|---|---|---|
| EP | 0 588 350 A2 | 3/1994 |
| EP | 1 174 528 A2 | 1/2002 |
| EP | 1 482 076 A1 | 12/2004 |
| EP | 1 722 009 A1 | 11/2006 |

(Continued)

OTHER PUBLICATIONS

Jeon et al., "Synthesis and characteristics of new quaternary Ti-Mo-Si-N coatings by a hybrid coating system", J. Vac. Sci. Technol. A. 26(1), Jan./Feb. 2008, American Vacuum Society.
International Search Report, dated Jun. 11, 2009, from corresponding PCT application.

*Primary Examiner* — Archene Turner
(74) *Attorney, Agent, or Firm* — Young & Thompson

(57) ABSTRACT

A cutting tool insert includes a body of cemented carbide, cermet, ceramics, cubic boron nitride based material or high speed steel and a hard and wear resistant coating including at least one metal nitride layer. The coating includes at least one layer of a thermally stabilized cubic structured $(Ti_{1-x+z}Si_xMe_z)N$ phase with $0.04<x<0.20$ and $0<z<0.10$, with a constant elemental composition throughout the layer where Me is one or more of the metal elements Y, Hf, Nb, Ta, Mo, W, Mn, Fe and Zn with a thickness of 0.5 to 10 μm. The layer is deposited using cathodic arc evaporation and is particularly useful for machining of stainless steel and super alloys.

7 Claims, 2 Drawing Sheets

FOREIGN PATENT DOCUMENTS

| | | | |
|---|---|---|---|
| EP | 1 736 565 A1 | 12/2006 |
| JP | 2000-326108 | * 11/2000 |
| JP | 2000-334606 | * 12/2000 |
| JP | 2002-326102 A | 11/2002 |
| JP | 2004-322279 A | 11/2004 |
| JP | 2004-338008 A | 12/2004 |
| JP | 2004-338058 A | 12/2004 |
| JP | 2007-152462 A | 6/2007 |
| WO | 2006/118513 A1 | 11/2006 |

* cited by examiner

THERMALLY STABILIZED (TI,SI)N LAYER FOR CUTTING TOOL INSERT

BACKGROUND OF THE INVENTION

The present invention relates to a cutting tool insert comprising of a body of a hard alloy of cemented carbide, cermet, ceramics, cubic boron nitride based material or high speed steel and a coating designed to be used in metal cutting applications generating high temperatures, particularly machining of super alloys and stainless steel. Said coating is composed of at least one layer of a thermally stabilized homogeneous cubic (Ti, Si, Me)N phase, where Me is one or more of the metal elements Y, Hf, Nb, Ta, Mo, W, Mn, Fe and Zn. The coating is grown by physical vapour deposition (PVD) and preferably by cathodic arc evaporation.

TiN has been widely used as hard layer on cutting tools due to its poor oxidation resistance at elevated temperatures, however, the focus has shifted towards more complex ternary and quaternary compounds, e.g. Ti—Al—N, Ti—Al—Si—N and Ti—Cr—Al—N with improved high temperature performance. For example, Ti—Al—Si—N has been reported as super hard, H>40 GPa due to a two phase structure consisting of crystalline phase of NaCl-type in combination with x-ray amorphous $Si_3N_4$ or $SiN_x$.

EP 1174528 discloses a multilayer-coated cutting tool insert. The first hard coating film is formed on the insert and a second hard coating film formed on the first hard coating film. The first hard coating film comprises one or more of Ti, Al and Cr, and one or more of N, B, C and O. The second hard coating film comprises Si and one or more metallic elements selected from the group consisting of metallic elements of Groups 4, 5 and 6 of the Periodic Table and Al, and one or more non-metallic elements selected from the group consisting of N, B, C and O.

EP 1736565 discloses a cutting tool insert, solid end mill, or drill, comprising a body and a coating. The coating is composed of one or more layers of refractory compounds of which at least one layer comprises a cubic (Me,Si)X phase, where Me is one or more of the elements Ti, V, Cr, Zr, Nb, Mo, Hf, Ta and Al, and X is one or more of the elements N, C, O or B.

WO 2006/118513 discloses a cutting tool insert, solid end mill or drill, comprising a body and a coating. The coating is composed of a cubic C-(Me, Si,) N-phase without coexisting amorphous phase.

EP 1722009 discloses a cutting tool insert, solid end mill, or drill, comprising a body and a coating. The coating is composed of one or more layers of refractory compounds of which at least one layer comprises a h-Me1Me2X phase, where Me 1 is one or more of the elements V, Cr, Nb, and Ta and Me2 is one or more of the elements Ti, Zr, Hf, Al, and Si and X is one or more of the elements N, C, O or B.

EP 0588350 discloses a hard layer of Ti—Si—N composite material on a body is carried out by using a source of evaporation possessing a composition of $Ti_aSi_b$ with a in the range of 75-85 at % and b 15-25 at %.

U.S. Pat. No. 6,033,768 discloses a hard coating consisting of a layer of a binary, ternary or quaternary TiAl based multicomponent material comprising nitride or carbonitride with an Al-content of 10 to 70 at %. The layer contains about 0.1 to 4 at % yttrium unevenly distributed over the entire layer.

JP 2004-338058 discloses a hard coating comprising a compound nitride layer of Ti, Si and Y. The layer has a concentration distribution structure wherein a maximum Si content and a minimum Si content exist in alternate repetition with a spacing of 0.01-0.1 µm. JP 2004-338008 and JP 2004-322279 disclose similar hard coatings comprising a compound (Ti, Si, Cr)N layer and (Ti, Si, Zr)N, respectively.

The trends towards dry-work processes for environmental protection, i.e., metal cutting operation without using cutting fluids (lubricants) and accelerated machining speed with improved process put even higher demands on the characteristics of the tool materials due to an increased tool cutting-edge temperature. In particular, coating stability at high temperatures, e.g., oxidation- and wear-resistance have become even more crucial.

It is an object of the present invention to provide a thermally stabilized (Ti,Si)N coated cutting tool yielding improved performance in metal cutting applications at elevated temperatures.

Surprisingly, it has been found that by introducing small amounts of the metal elements Y, Hf, Nb, Ta, Mo, W, Mn, Fe and Zn in (Ti,Si)N layers leads to improved high temperature metal cutting properties.

DETAILED DESCRIPTION OF THE INVENTION

Figure 1:
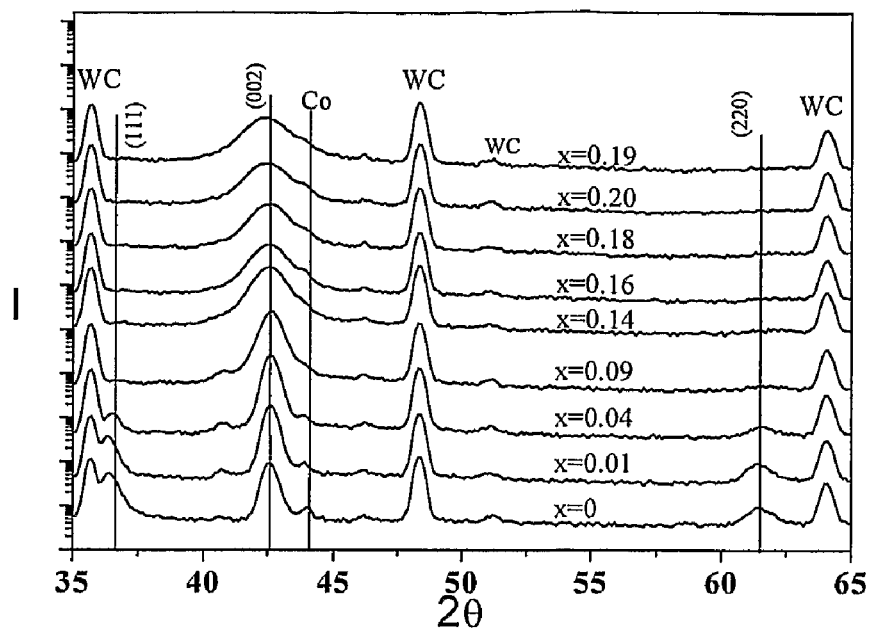
FIG. 1 X-ray diffraction patterns from $(Ti_{1-x}Si_x)N$ layers as function of the Si content (x).

According to the present invention, there is provided a cutting tool for machining by chip removal comprising a body of a hard alloy of cemented carbide, cermet, ceramics, cubic boron nitride based material or high speed steel onto which a wear and high temperature resistant coating is deposited composed of at least one cubic structured $(Ti_{1-(x+z)}Si_xMe_z)N$ layer 0.04<x<0.20, preferably 0.06<x<0.12 and 0<z<0.10, preferably 0.005<z<0.05, with a constant elemental composition throughout the layer, where Me is one or more of the metal elements Y, Hf, Nb, Ta, Mo, W, Mn, Fe and Zn, preferably Y, Nb, Mo and Fe. The layer has a thickness of 0.5 to 10 µm, preferably 0.5 to 5 µm.

Said layer has a compressive stress level of –6.0<σ<–0.5 GPa, preferably of –4.0<σ<–1.0 GPa.

Said layer has a hardness at room temperature of 28<H<44, preferably 33<H<40 GPa.

The composition, x and z, of $(Ti_{1-(x+z)}Si_xMe_z)N$ is determined by, e.g., EDS or WDS.

Said body may be coated with an inner single- and/or multilayer coating of, e.g., TiN, TiC, Ti(C,N) or (Ti,Al)N, preferably (Ti,Al)N and/or an outer single- and/or multilayer coating of, e.g., TiN, TiC, Ti(C,N) or (Ti,Al)N, preferably (Ti,Al)N with a total coating thickness of 1 to 20 µm, preferably 1 to 10 µm and most preferably 2 to 7 µm according to prior art.

The deposition method for the coatings of the present invention is based on cathodic arc evaporation of an alloyed or composite cathode under the following conditions; c-(Ti, Si, Me)N layers are grown using Ti+Si+Me-cathodes with a composition expressed as $Ti_{1-(x+z)}Si_xMe_z$ with 0.04<x<0.20, preferably 0.06<x<0.12 and 0<z<0.10, preferably $0.005<z<0.05$, where Me is one or more of the metal elements Y, Hf, Nb, Ta, Mo, W, Mn, Fe and Zn, preferably Y, Nb, Mo and Fe. The evaporation current is between 50 A and 200 A. The layers are grown in an Ar+$N_2$ atmosphere, preferably in a pure $N_2$ atmosphere at a total pressure of 0.5 Pa to 7.0 Pa, preferably 1.5 Pa to 5.0 Pa. The bias is −10 V to −80 V, preferably −40 V to −60V. The deposition temperature is between 400° C. and 700° C., preferably between 500 and 600° C.

The invention also relates to the use of cutting tool inserts according to the above for machining of super alloys and stainless steel at cutting speeds of 50-400 m/min, preferably 75-300 m/min, with an average feed, per tooth in the case of milling, of 0.08-0.5 mm, preferably 0.1-0.4 mm depending on cutting speed and insert geometry.

Example 1

Cemented carbide inserts with composition 94 wt % WC-6 wt % Co were used.

Before deposition, the inserts were cleaned in ultrasonic baths of an alkali solution and alcohol. The system was evacuated to a pressure of less than $2.0 \times 10^{-3}$ Pa, after which the inserts were sputter cleaned with Ar ions. $(Ti_{1-x}Si_x)N$ layers, $0<x<0.20$ were grown by cathodic arc evaporation using cathodes with a composition varying between pure Ti and $Ti_{0.75}Si_{0.25}$, 63 mm in diameter at 500° C. The layers were deposited in pure $N_2$ atmosphere at a total pressure of 4 Pa, using a bias of −50 V and an evaporation current of 60 A to a total thickness of about 3 μm.

The composition, x, of the $(Ti_{1-x}Si_x)N$ layers was estimated by energy dispersive spectroscopy (EDS) analysis using a LEO Ultra 55 scanning electron microscope with a Thermo Noran EDS detector operating at 10 kV. The data were evaluated using a Noran System Six (NSS ver 2) software.

X-ray diffraction (XRD) patterns of the as-deposited $(Ti_{1-x}Si_x)N$ layers were obtained using Cu K alpha radiation and a θ-2θ configuration as function of the Si content (x), see FIG. 1, corresponding to a NaCl structure of all layers.

Residual stresses, σ, of the $(Ti_{1-x}Si_x)N$ layers were evaluated by XRD measurements using the $\sin^2\psi$ method (see e.g. I. C. Noyan, J. B. Cohen, Residual Stress Measurement by Diffraction and Interpretation, Springer-Verlag, New York, 1987). The measurements were performed using CuKα-radiation on the $(Ti_{1-x}Si_x)N$ (422)-reflection. The residual stress values were within $-4.0<\sigma<-2.0$ GPa for the different layers as evaluated using a Possion's ratio of ν=0.25 and Young's modulus of E=450 GPa.

In order to simulate the apparent heat effect that occur during metal machining, controlled experiments by isothermal heat treatments were made of the inserts in inert Ar atmosphere at 1000° C. for 120 min.

Figure 2:
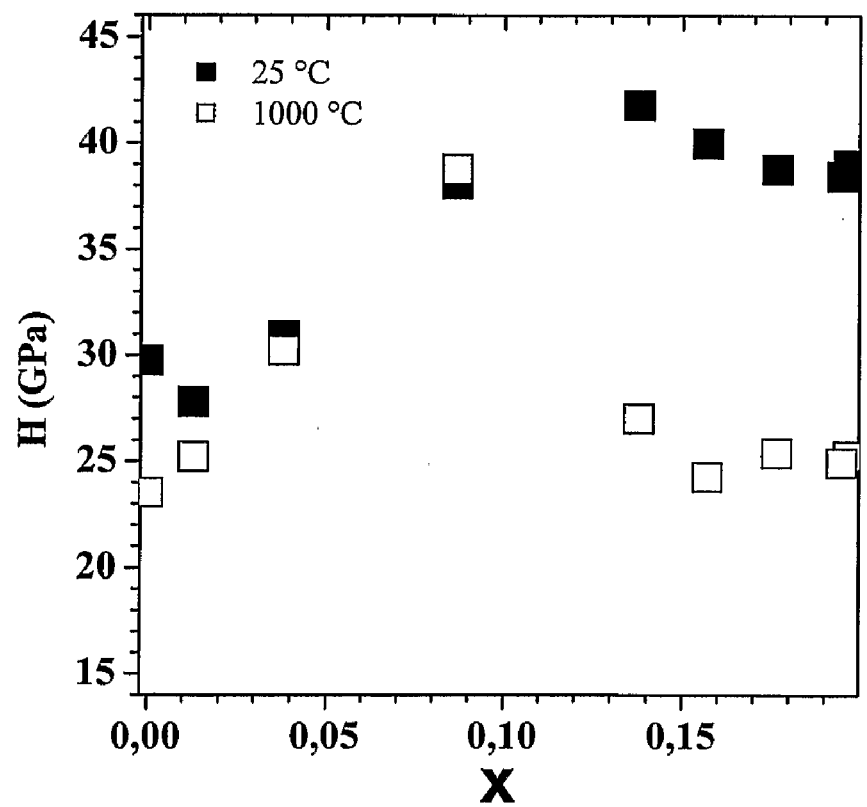
FIG. 2 Hardness (H) of $(Ti_{1-x}Si_x)N$ layers as a function of the Si content (x) as obtained at room temperature, before and after heat treatment at 1000° C., 2 h.

Hardness data was estimated by the nanoindentation technique of the layers after mechanical polishing of the surface using a MTS NanoIndenter XP system with a Berkovich diamond tip with a maximum tip load of 25 mN. FIG. 2 shows the hardness (H) of $(Ti_{1-x}Si_x)N$ layers as a function of the Si content (x) as obtained at room temperature, before and after heat treatment at 1000° C. for 2 h. Optimum hardness is obtained for the $(Ti_{1-x}Si_x)N$ layer with x=0.09 corresponding to the best layer composition for metal machining applications.

Figure 3:
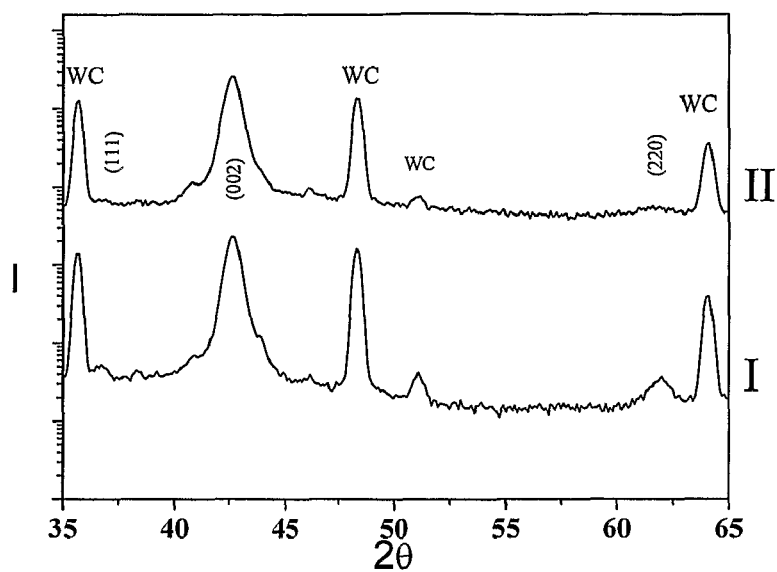
FIG. 3 X-ray diffraction patterns from $(Ti_{1-x}Si_x)N$, x=0.09 at room temperature (I) and after heat treatment at 1000° C., 2 h (II).

FIG. 3 shows the XRD pattern of a $(Ti_{1-x}Si_x)N$ layer, x=0.09, before (I) and after (II) heat treatment at 1000° C. using CuKα-radiation and a θ-2θ configuration. The heat treatment has no effect on the NaCl structure.

Example 2

Grade A: Inserts from example 1 with a $(Ti_{1-x}Si_x)N$, x=0.09 composition having a hardness of 39 GPa and a compressive stress level of −3.1 GPa were used.

Example 3

Grade B: Example 1 was repeated using a $Ti_{1-(x+z)}Si_xY_z$ cathode, x=0.10 and z=0.03.

The composition of the resulting $(Ti_{1-(x+z)}Si_xY_z)N$ layer was x=0.09 and z=0.02. The hardness of the as-deposited layer was 38 GPa and the residual stress level −3.5 GPa.

Figure 4:
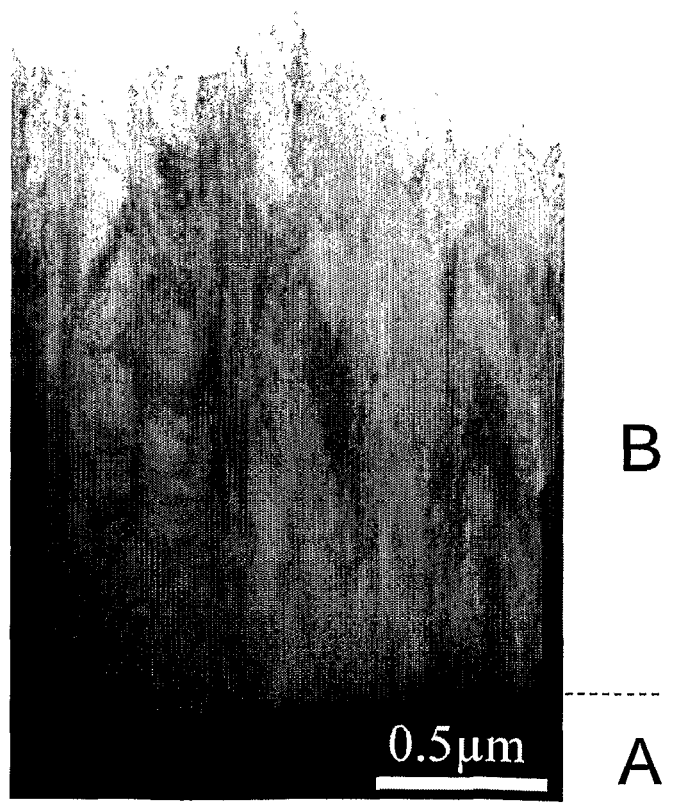
FIG. 4 Cross-sectional transmission electron micrograph from a cubic $(Ti_{1-(x+z)}Si_xY_z)N$ layer (x=0.09, z=0.02) according to the invention showing (A) cemented carbide and (B) layer.

FIG. 4 shows a cross-sectional transmission electron micrograph from a cubic $(Ti_{1-x}Si_xY_z)N$ layer (x=0.09, z=0.02), which exhibits a dense, columnar and homogenous microstructure.

Example 4

Grade C: Example 1 was repeated using a $Ti_{1-(x+z)}Si_xNb_z$ cathode, x=0.10 and z=0.06.

The composition of the resulting $Ti_{1-(x+z)}Si_xNb_z)N$ layer was x=0.10 and z=0.05. The hardness of the as-deposited layer was 38 GPa and the residual stress level −3.1 GPa.

Example 5

Grade D: Example 1 was repeated using a $Ti_{1-(x+z)}Si_xMo_z$ cathode, x=0.10 and z=0.03.

The composition of the resulting $Ti_{1-(x+z)}Si_xMo_z)N$ layer was x=0.08 and z=0.03. The hardness of the as-deposited layer was 36 GPa and the residual stress level −2.1 GPa.

Example 6

Grade E: Example 1 was repeated using a $Ti_{1-(x+z)}Si_xFe_z$ cathode, x=0.08 and z=0.05.

The composition of the resulting $Ti_{1-(x+z)}Si_xFe_z)N$ layer was x=0.08 and z=0.04. The hardness of the as-deposited layer was 38 GPa and the residual stress level −2.5 GPa.

Example 7

Grade F: Example 1 was repeated using a $Ti_{1-(x+z)}Si_xY_{z/2}Fe_{z/2}$ cathode, x=0.10 and z=0.04.

The composition of the resulting $Ti_{1-(x+z)}Si_xY_{z/2}Fe_{z/2}$ layer was x=0.09 and z=0.04. The hardness of the as-deposited layer was 36 GPa and the residual stress level −2.2 GPa.

Example 8

Grades A-F were tested in hardened steel according to:
Geometry: CNMG120408-MF1
Application: Continuous turning
Work piece matererial: AISI 5115
Cutting speed: 180 m/min
Feed: 0.15 mm/rev
Depth of cut: 1 mm
Tool life criteria, flank wear (vb)>0.3 mm

| Grade | Tool life (min) |
|-------|-----------------|
| A | 16.1 |
| B | 20.6 |
| C | 17.5 |
| D | 18.2 |
| E | 17.2 |
| F | 19.2 |

Example 9

Grades A-F were tested in super alloy according to:
Geometry: CNMG120412-MR3
Application: Continuous turning
Work piece material: Inconel 718
Cutting speed: 90 m/min
Feed: 0.2 mm/rev
Depth of cut: 0.5 mm
Tool life criteria, flank wear (vb)>0.2 mm

| Grade | Tool life (min) |
|-------|-----------------|
| A | 8.5 |
| B | 10.5 |
| C | 9.3 |
| D | 9.9 |
| E | 9.1 |
| F | 10.2 |

The invention claimed is:

1. A cutting tool insert comprising a body of cemented carbide, cermet, ceramics, cubic boron nitride based material or high speed steel and a hard and wear resistant coating comprising at least one metal nitride layer, wherein said layer is a cubic structured $(Ti_{1-(x+z)}Si_xMe_z)N$ with $0.04<x<0.20$ and $0<z<0.10$ with a constant elemental composition throughout the layer, where Me is one or more of the metal elements selected from the group consisting of Y, Hf, Nb, Ta, Mo, W, Mn, Fe and Zn with a layer thickness of 0.5 to 10 μm.

2. The cutting tool insert according to claim 1, wherein said layer has a hardness at room temperature of $28<H<44$ GPa.

3. The cutting tool insert according to claim 1, wherein said layer has a compressive stress level of $-6.0<\sigma<-0.5$ GPa.

4. The cutting tool insert according to claim 1, wherein said layer has been deposited with PVD.

5. The cutting tool insert according to claim 1, wherein said body is coated with an inner single- and/or multilayer coating of TiN, TiC, Ti(C,N) or (Ti,Al)N and/or an outer single- and/or multilayer coating of TiN, TiC, Ti(C,N) or (Ti,Al)N to a total coating thickness of 1 to 20 μm.

6. A method of making a cutting tool insert according to claim 1, wherein said layer is a cubic (Ti, Si, Me)N phase grown by cathodic arc evaporation, with a thickness of 0.5 to 10 μm using a Ti+Si+Me-cathode with a composition expressed as $Ti_{1-(x+z)}Si_xMe_z$ with $0.04<x<0.20$ and $0<z<0.10$, where Me is one or more of the metal elements selected from the group consisting of Y, Hf, Nb, Ta, Mo, W, Mn, Fe and Zn, and with an evaporation current between 50 A and 200 A depending on the cathode size, in an $Ar+N_2$ atmosphere at a total pressure of 0.5 Pa to 7.0 Pa with a bias between −10 V and −80 V at a temperature between 400° C. and 700° C.

7. A method of using a cutting tool inserts according to claim 1 for machining of stainless steel and super alloys at cutting speeds of 50-400 m/min with an average feed of 0.08-0.5 mm depending on cutting speed and insert geometry.

* * * * *

UNITED STATES PATENT AND TRADEMARK OFFICE
CERTIFICATE OF CORRECTION

PATENT NO.       : 8,389,115 B2                                             Page 1 of 1
APPLICATION NO.  : 12/919269
DATED            : March 5, 2013
INVENTOR(S)      : Johansson et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 325 days.

Signed and Sealed this
First Day of September, 2015

Michelle K. Lee
*Director of the United States Patent and Trademark Office*